(12) United States Patent
Ebertseder et al.

(10) Patent No.: US 6,635,567 B2
(45) Date of Patent: Oct. 21, 2003

(54) METHOD OF PRODUCING ALIGNMENT MARKS

(75) Inventors: Eva Ebertseder, Dresden (DE); Matthias Lehr, Dresden (DE); Torsten Werneke, Dresden (DE); Jochen Hanebeck, Ottobrunn (DE); Jürgen Pahlitzsch, Wallroda (DE)

(73) Assignee: Infineon Technologies AG, Munich (DE)

( * ) Notice: Subject to any disclaimer, the term of this patent is extended or adjusted under 35 U.S.C. 154(b) by 77 days.

(21) Appl. No.: 09/758,997

(22) Filed: Jan. 11, 2001

(65) Prior Publication Data

US 2001/0019880 A1 Sep. 6, 2001

(30) Foreign Application Priority Data

Jan. 11, 2000 (DE) .......................................... 100 00 759

(51) Int. Cl.$^7$ ...................... H01L 21/4763; H01L 21/76
(52) U.S. Cl. ...................... 438/638; 438/401; 438/462; 438/631
(58) Field of Search ................................ 438/638, 642, 438/675, 681, 975, 401, 462, 463, 631, 636

(56) References Cited

U.S. PATENT DOCUMENTS

| 5,270,255 | A | * | 12/1993 | Wong .......................... 437/194 |
| 5,407,698 | A | * | 4/1995 | Emesh .......................... 427/99 |
| 5,663,099 | A | * | 9/1997 | Okabe et al. ................ 438/642 |
| 5,786,260 | A | | 7/1998 | Jang et al. |
| 5,869,383 | A | * | 2/1999 | Chien et al. ................. 438/401 |
| 5,935,764 | A | * | 8/1999 | Kakehashi ................... 430/314 |
| 6,025,652 | A | * | 2/2000 | Tsukamoto ................... 257/797 |
| 6,057,175 | A | * | 5/2000 | Milla et al. ................. 438/113 |
| 6,215,197 | B1 | * | 4/2001 | Iwamatsu ..................... 257/797 |
| 6,340,434 | B1 | * | 1/2002 | Mizuno et al. ............... 216/38 |

* cited by examiner

Primary Examiner—Stephen D. Meier
Assistant Examiner—Pamela Perkins
(74) Attorney, Agent, or Firm—Laurence A. Greenberg; Werner H. Stemer; Gregory L. Mayback

(57) ABSTRACT

Alignment marks (overlay marks or alignment markers) are produced in a semiconductor structure with integrated circuits. Contact holes and alignment trenches are etched into an insulator layer and in each case open out at a first metal layer at their undersides. Metal is deposited into the alignment trenches and the contact holes. With a subsequent chemical mechanical polishing procedure, the metal areas are lowered in the region of the alignment trenches and form profiles for the alignment marks in a second metal layer, which is deposited on the insulator layer.

17 Claims, 2 Drawing Sheets

METHOD OF PRODUCING ALIGNMENT MARKS

BACKGROUND OF THE INVENTION

Field of the Invention

The invention relates to a method for producing alignment marks in a structure with integrated circuits.

Such structures with integrated circuits may be formed, in particular, by DRAM cell configurations incorporated in a semiconductor substrate formed by a wafer.

In particular for the wiring of the integrated circuits, a plurality of layers lying one above the other are applied to the semiconductor substrate, systems of interconnects made of metal running in the layers. For this purpose, an insulator layer, which is formed, in particular, by an oxide layer, is applied to the semiconductor substrate in particular directly or with the interposition of further layers. In order to fabricate the connections of interconnects, contact holes are etched into said insulator layer. The contact holes thus fabricated are then filled with metal, preferably tungsten. By means of a CMP (chemical mechanical polishing) process, the surface of the oxide layer, in particular metal projecting above the upper edges of the contact holes, is then polished in a planar fashion. A metal layer is subsequently applied to the oxide layer. For the patterning of this metal layer, a resist mask is subsequently applied.

One problem here is the necessity of exactly aligning the resist mask on the metal layer. In particular, the resist mask has to be aligned with the structure of the interconnects in the oxide layer. However, since the metal layer is opaque, the structures in the oxide layer cannot directly be detected optically. Therefore, the alignment marks are arranged in the metal layer as local depressions which can be detected by optical measuring instruments such as laser interferometers for example.

In order to fabricate such alignment marks, alignment trenches are etched into the oxide layer at predetermined locations. These alignment trenches are etched together with the contact holes into the oxide layer. Afterwards, the contact holes as well as the alignment trenches are filled with metal, whereupon the surface processing by means of the CMP process takes place.

The widths of the alignment trenches are considerably greater than the widths of the contact holes. Typically, the width of a contact hole is about 0.3 $\mu$m, while the width of an alignment trench is about 2 $\mu$m.

The consequence of this is that, as a result of the pressure on the top sides of the metal layers during the polishing operation of the CMP process, the metal surfaces of the metal layers in the alignment trenches are lowered, but the metal surfaces of the metal layers in the contact holes are not. This is due to the fact that the metal layer, in particular when tungsten is used, is softer than the oxide layer. With the small widths of the contact holes, during the polishing operation the oxide layer exercises a supporting effect which extends over the entire area of a contact hole. Since the widths of the alignment trenches are considerably greater than the widths of the contact holes, the supporting effect of the oxide layer acts only in the edge regions of the alignment trenches, resulting in each case in a lowering of the metal surface in the center of the alignment trenches during the CMP process.

These lowered portions form profiles for the alignment marks, the alignment marks lying above the alignment trenches after the deposition of the metal layer. In this case, the alignment marks are designed as depressions which essentially correspond to the profiles produced beforehand.

In order that the alignment marks can be detected by the respective optical measuring instruments, the transitions between the planar metal surface and the depressions forming the alignment marks must fall as steeply as possible in the edge regions. Furthermore, the alignment marks must be able to be fabricated reproducibly in order that they can be reliably detected by the measuring instruments. It has been shown that these requirements can be fulfilled only inadequately in the case of conventional prior art alignment marks of this type.

An essential problem in the fabrication of alignment marks of this type is that the lowering of the metal surface in the CMP process cannot be fabricated reproducibly. Accordingly, the profiles of the depressions forming the alignment marks vary for different production batches, as a result of which they become more difficult to measure or their measurement is corrupted. A further problem is that during the CMP process, residues of polishing agent settle in the lowered portions of the metal layers of the alignment trenches. On account of the lack of reproducibility in the formation of the lowered portions, the surfaces of the latter have irregularities in which the residues of polishing agent collect in such a way that they can no longer be removed. In this case, the residues of polishing agent collect, in particular, in the edge regions of the lowered portions. This in turn has the effect that the profiles of the lowered portions no longer have the necessary steepness in the edge regions, so that, accordingly, only gently falling edges with shallow slopes are obtained in the case of the alignment marks. As a result, the alignment marks can no longer be detected sufficiently reliably by the measuring instruments.

U.S. Pat. No. 5,869,383 describes a method for producing alignment marks which are used for aligning a laser on a semiconductor substrate. The semiconductor substrate comprises a silicon wafer and has a configuration of integrated circuits forming a DRAM cell arrangement, for example. To ensure that defective circuits arising during the fabrication of such DRAM cell arrangements do not lead to defective functioning of the entire DRAM cell arrangement, at least some of the circuits are designed to be redundant. If one of the doubly provided circuits is defective, then it is deactivated and the assigned corresponding circuit is activated.

Specific circuits are deactivated by means of the laser by a fusible layer segment which is applied on the semiconductor substrate being melted. This layer segment is preferably composed of polysilicon. This polysilicon layer segment is applied to the semiconductor substrate with the interposition of an insulator layer. A plurality of dielectric intermediate layers are applied to the polysilicon layer segments and the semiconductor substrate.

A passivation layer made of silicon oxide or silicon nitride is applied to these dielectric intermediate layers. The passivation layer has a layer thickness in the range between 200 nm and 1000 nm.

A resist layer is applied to this passivation layer for the purpose of forming a resist mask. By means of a photolithographic process, a hole pattern is produced in the resist layer. By means of an etching process, preferably an RIE (reactive ion etching) method, recesses are produced in the dielectric intermediate layers through the holes in the resist mask. These recesses lie above the polysilicon layer segments, the depths of the recesses being chosen such that the bottom of a recess in each case lies closely above the respective polysilicon layer segment. In order to deactivate integrated circuits, the laser beams emitted by the laser are then guided into the respective recesses, the underlying polysilicon layer segments thereby being melted.

The laser is aligned by means of the alignment marks. In order to fabricate the alignment marks, a metal layer is applied to the surface of the topmost dielectric intermediate layer at predetermined locations. An antireflection layer is then applied to this metal layer. The passivation layer is subsequently applied to the entire substrate, which layer covers the uncovered parts of the uppermost dielectric intermediate layer and also the metal layer with the antireflection layer lying on it.

The resist layer is then applied to the antireflection layer. During the photolithographic process for producing the hole pattern, a hole pattern is produced in the resist layer and is used, in the subsequent etching process, to produce not only the recesses in the dielectric intermediate layers above the polysilicon layer segments but also recesses in the passivation layer and the antireflection layer above the metal layer. These recesses are etched through as far as the surface of the metal layer and form the alignment marks.

U.S. Pat. No. 5,270,255 discloses a further method for producing alignment marks. There, an insulator layer is applied to a semiconductor substrate with integrated circuits, contact holes for producing interconnects for wiring integrated circuits in the semiconductor substrate being etched into said insulator layer. In addition to the contact holes, alignment trenches are also etched into the insulator layer for the purpose of producing the alignment marks.

A TiN layer is subsequently applied to the insulator layer in a first sputtering process. The layer thickness of that layer is about 100 nm to 500 nm, so that after the layer has been applied, the profiles of the alignment trenches and contact holes are still largely retained.

In a second sputtering process, a metal layer is applied whose layer thickness is only about 150 nm to 200 nm, so that even after this layer has been applied, the profiles of the contact holes and alignment trenches are still largely retained.

Afterwards, in a third sputtering process, a further metal layer is applied whose layer thickness lies in the range from 200 nm to 400 nm. This layer thickness is chosen such that the contact holes, which have a smaller width than the alignment trenches, are filled virtually completely with metal. The alignment trenches, however, are only partially filled with metal, so that trough-like depressions arise in their regions in each case at the surface.

Through the application of a final metal layer and through a suitable choice of sputtering process, it is ensured that the depressions above the alignment trenches are profiled more distinctly and have distinctly formed edges particularly in the edge regions.

These profiled depressions in the uppermost metal layer form the alignment marks, which can be used, for example, to align a resist mask on the metal layer.

U.S. Pat. No. 5,663,099 describes a method of producing alignment marks in which an insulator layer is applied on the semiconductor substrate. Contact holes and alignment trenches are etched into the insulator layer and open out on the semiconductor substrate at their underside. The contact holes and alignment trenches are filled with metal. The surface of the insulator layer is subsequently treated. A second metal layer is deposited on the insulator layer, local depressions arising on the top side of the metal layer in the region of the alignment trenches. The depressions form the alignment marks.

U.S. Pat. No. 5,786,260 generally describes the use of chemical mechanical polishing (CMP) in the production of alignment marks.

SUMMARY OF THE INVENTION

The object of the present invention is to provide a method of producing alignment marks which overcomes the above-noted deficiencies and disadvantages of the prior art devices and methods of this general kind, and which allows the alignment marks produced in the process to be fabricated with little outlay and also to provide alignment marks which can be reliably detected by measuring instruments.

With the above and other objects in view there is provided, in accordance with the invention, a method of producing alignment marks in a structure with integrated circuits, which comprises the following method steps:

forming a first metal layer over a semiconductor substrate with integrated circuits, the first metal layer having a thickness and a surface;

applying an insulator layer on the metal layer, the insulator layer having a thickness significantly greater than the thickness of the first metal layer;

etching contact holes and alignment trenches into the insulator layer, the contact holes and the alignment trenches in each case opening out at the metal layer and the alignment trenches having widths significantly greater than the widths of the contact holes;

introducing metal into the alignment trenches and the contact holes and subsequently treating the surface of the insulator layer with chemical mechanical polishing, wherein the metal areas are lowered in a region of the alignment trenches and form profiles for the alignment marks;

depositing a second metal layer on the insulator layer, whereby local depressions are formed on a top side of the metal layer in the region of the alignment trenches in accordance with the respective profiles, and wherein the depressions form alignment marks.

In summary, in the method according to the invention, the production of alignment marks takes place together with the fabrication of interconnects for the wiring of integrated circuits in a semiconductor substrate.

In a first method step, a first metal layer is applied over the semiconductor substrate with the integrated circuits.

An insulator layer is subsequently applied to the first metal layer.

Afterwards, contact holes and alignment trenches are etched into the insulator layer, the contact holes and alignment trenches opening out at the metal layer at their underside. The contact holes serve for fabricating connections of interconnects for the wiring of the integrated circuits.

This is followed by introduction of metal into the alignment trenches and the contact holes and a subsequent treatment of the surface of the insulator layer by chemical mechanical polishing (CMP), the metal surfaces being lowered in the region of the alignment trenches and forming profiles for the alignment marks.

Finally, a second metal layer is deposited on the insulator layer, the metal layer having local depressions in the region of the alignment trenches in accordance with the respective profiles, said depressions forming the alignment marks.

An essential advantage of the method according to the invention is that the production of the alignment marks takes place together with the fabrication of the connections of interconnects for the wiring of the integrated circuits in the semiconductor substrate, no additional process steps being necessary for the production of the alignment marks.

Moreover, it is advantageous that it is possible to incorporate the alignment marks in the metal layer above the insulator layer with the contact holes, without interposition of further layers being necessary in the process. Accordingly, the alignment marks can be produced with a minimum of process-engineering outlay.

Despite the low fabrication outlay, the alignment marks are designed in such a way that they can be reliably detected by optical measuring instruments. An essential reason for this is that with the method according to the invention, the alignment marks can be produced with high reproducibility. This high reproducibility is obtained, in particular, by virtue of the fact that the metal layer is provided below the alignment trenches in the insulator layer. This metal layer serves as an etching stop during the etching of the alignment trenches, so that the surfaces of the metal layer form reproducible planar bottoms of the alignment trenches.

The effect thereby achieved is that after the introduction of metal into the alignment trenches, the chemical mechanical polishing results in a correspondingly regular and reproducible lowering of the metal surface in the region of the alignment trenches. Accordingly, residues of polishing agent, which undesirably impair the profiles of the lowered portions, do not remain on these lowered portions during the chemical mechanical polishing. In particular, residues of polishing agent are prevented from settling on the edges of the lowered portions. Consequently, the chemical mechanical polishing results in a lowering of the metal in the region of the alignment trenches which, at the edges, forms a steep transition to the planar surface of the insulator layer.

In accordance with further features of the invention, the first metal layer is formed of tungsten or AlCu. Preferably, the alignment trenches and contact holes are filled with tungsten. Yet further, the second metal layer is also preferably formed of tungsten, and the insulator layer is an oxide layer, such as an oxide layer composed of $SiO_2$.

In another preferred embodiment, the second metal layer has a layer thickness of about 300 nm and the insulator layer has a layer thickness of about 500 nm.

In a particularly advantageous mode of the invention, the widths of the alignment trenches are considerably greater than the widths of the contact holes. In this case, the widths of the contact holes are chosen to be so small that during the chemical mechanical polishing of the surface of the metal in the contact holes, the harder insulator layer exercises a supporting effect for the softer metal in the contact holes which extends over the entire area of a contact hole. The result of this is that the surface of the metal in the contact holes is not lowered, or is lowered only very little, during the chemical mechanical polishing.

By contrast, the widths of the alignment trenches are chosen to be so large that the supporting effect of the surrounding insulator layer acts only in the edge regions of the alignment trenches. Consequently, the surface of the metal in the alignment trenches is lowered, the degree of lowering being predeterminable through the process parameters of the chemical mechanical polishing and the widths of the alignment trenches. In accordance with an added feature of the invention, the chemical mechanical polishing includes an etching process in which a thin surface layer of the insulator layer is removed, so that the metal areas in the region of the contact holes project slightly above a top surface of the insulator layer. This embodiment is particularly advantageous. During the etching process, a thin surface layer of the insulator layer is removed. The effect thereby achieved is that the metal areas in the region of the contact holes project slightly above the surface of the insulator layer. The lowered portions of the metal areas in the region of the alignment trenches, however, have such a large depth that they remain virtually unimpaired by the etching process.

After the chemical mechanical polishing, a metal layer is applied to the insulator layer, corresponding depressions being obtained in accordance with the profiles of the lowered portions in the region of the alignment trenches on the top side of the metal layer. These depressions, which form the alignment marks, have regular and, in particular in the edge region, steep profiles and can therefore be reliably detected by means of optical measuring instruments. Since, in order to form these depressions, the metal layer is applied directly to the lowered portions of the metal in the alignment trenches, the depressions can be fabricated with a high reproducibility corresponding to the lowered portions.

With the alignment marks fabricated in this way, it is possible, in particular, for a resist mask applied to the metal layer to be aligned relative to this metal layer.

Other features which are considered as characteristic for the invention are set forth in the appended claims.

Although the invention is illustrated and described herein as embodied in a method for producing alignment marks, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

The diagrammatic illustration in FIGS. 1 to 4 relates to an exemplary embodiment of the method for producing alignment marks according to the invention.

Figure 1:
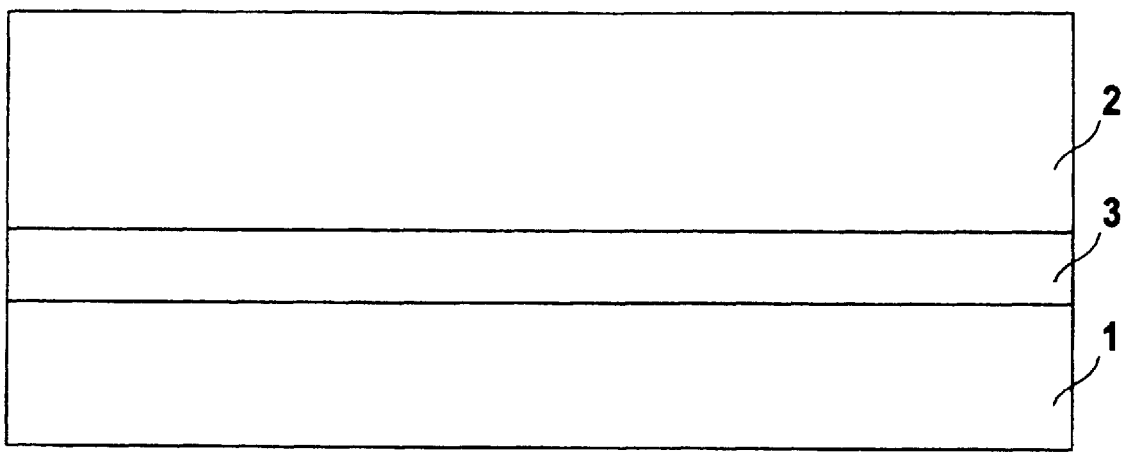
FIGS. 1 to 4 are diagrammatic sectional illustrations of the individual method steps for producing alignment marks in a structure with integrated circuits.

Referring now to the figures of the drawing in detail and first, particularly, to FIG. 1 thereof, there is seen a detail of a semiconductor substrate 1, in which a non-illustrated configuration of integrated circuits is provided. The semiconductor substrate 1 is preferably formed by a silicon wafer. The integrated circuits are a DRAM cell arrangement in the present exemplary embodiment. The integrated circuits are wired via a system of interconnects. In order to produce connections between these interconnects, an insulator layer 2 is deposited above the semiconductor substrate 1. The insulator layer 2 is preferably formed by an oxide layer. By way of example, $SiO_2$ is used as the oxide. The layer thickness of the oxide layer is about 500 nm in the present exemplary embodiment.

In principle, it is also possible to provide a plurality of insulator layers 2 between which, if appropriate, further layers are interposed.

According to the invention, a first metal layer 3 is provided between the semiconductor substrate 1 and the insulator layer 2. The metal layer 3 is preferably composed of tungsten W or AlCu. The layer thickness of this metal layer 3 is significantly less than the layer thickness of the insulator layer 2. What is important here is that the metal layer 3 has a planar surface which can be fabricated reproducibly.

Figure 2:
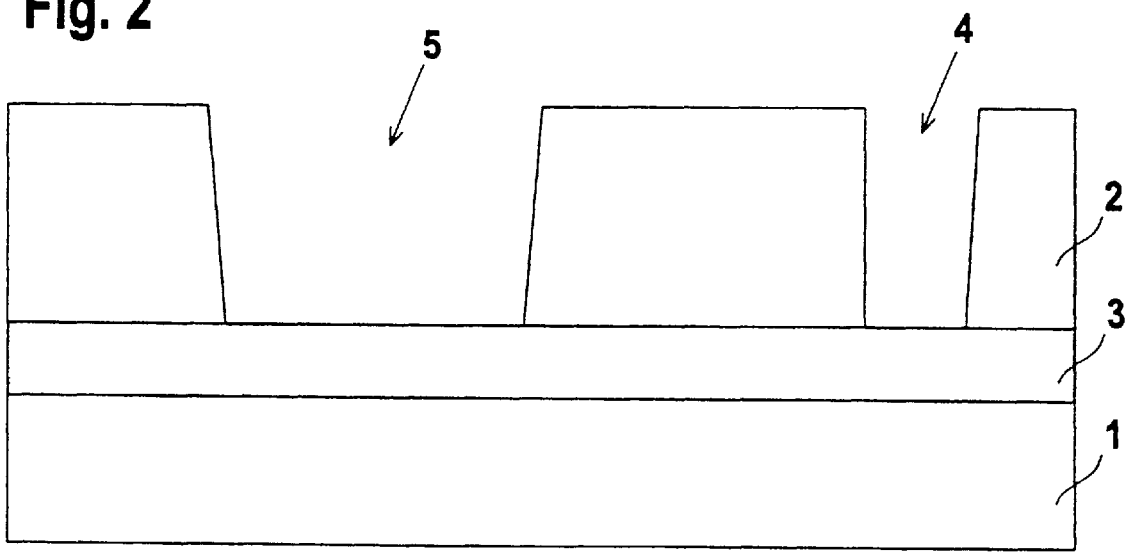

In accordance with the arrangement of the connections to be produced between the individual interconnects, contact holes 4 are etched into the insulator layer 2. As shown in FIG. 2, the contact holes 4 cut through the oxide layer completely, so that their undersides open out at the top side of the metal layer 3.

Simultaneously with the etching of the contact holes 4, alignment trenches 5 are also etched into the insulator layer 2. These alignment trenches 5 serve for producing alignment marks. The alignment trenches 5 also cut through the insulator layer 2 completely, so that the undersides of the alignment trenches 5 open out at the top side of the first metal layer 3.

FIG. 2 diagrammatically illustrates an alignment trench 5 and a contact hole 4. This illustration is not to scale in so far as the alignment trenches 5 are not arranged directly next to the contact holes 4. While the contact holes 4 are arranged such that they lie in the useful region of the wafer, for the wiring of the integrated circuits, the alignment trenches 5 lie in the region of the sawing frame of the wafer, which is rejected material after the processing of the wafer.

Since the contact holes 4 and likewise the alignment trenches 5 open out at the top side of the metal layer 3, they have the same depth. By contrast, the widths of the alignment trenches 5 are considerably greater than the widths of the contact holes 4. Typically, the widths of the contact holes 4 are about 0.3 $\mu$m (300 nm), while the widths of the alignment trenches 5 are about 2 $\mu$m (2000 nm).

Figure 3:
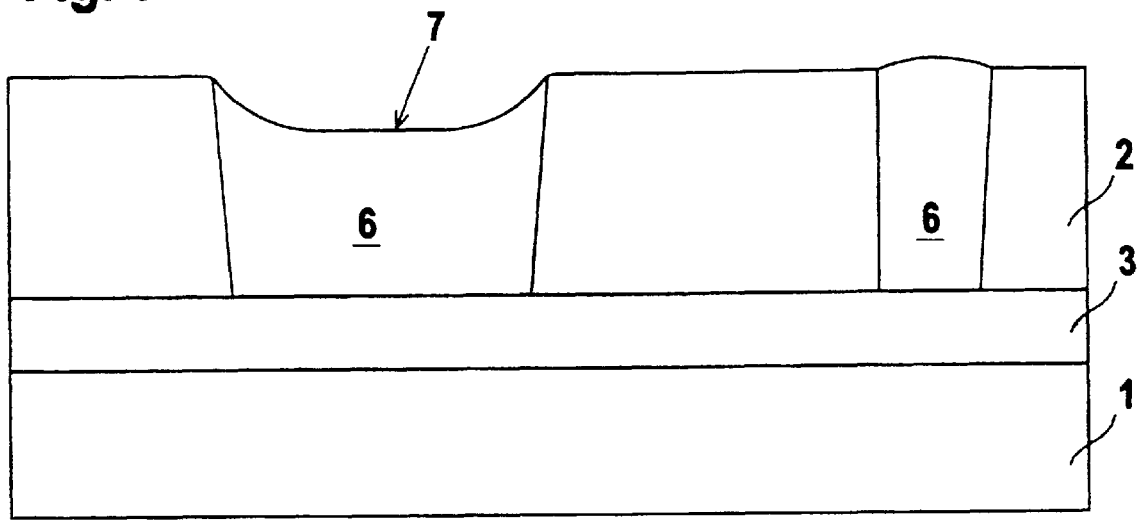

After the etching process, metal 6 is deposited in the individual alignment trenches 5 and contact holes 4. In this case, tungsten is preferably used as the metal 6. During this process, small residues of metal 6 usually project above the upper edges of the alignment trenches 5 and contact holes 4 and, moreover, cover the top sides of the insulator layer 2. Therefore, chemical mechanical polishing is subsequently effected in order to polish the top side of the insulator layer 2 and, in particular, in order to polish the top sides of the alignment trenches 5 and contact holes 4 filled with metal 6. FIG. 3 shows the top side of the insulator layer 2 processed in this way.

As can be seen from FIG. 3, the top side of the metal 6 filled into a contact hole 4 projects slightly above the top side of the insulator layer 2. By contrast, the chemical mechanical polishing results in a lowered portion 7 at the top side in the case of the metal 6 filled into the alignment trenches 5.

This structure is obtained through a suitable design of the process sequence during the chemical mechanical polishing. Firstly, the surface of the insulator layer 2 and also the surfaces of the metal 6 which was deposited into the contact holes 4 and alignment trenches 5 are mechanically polished. Since the metal 6 in the alignment trenches 5 and in the contact holes 4 is considerably softer than the insulator layer 2, the metal 6 yields under the pressure of polishing, but the insulator layer 2 does not. As a result, the metal surface is lowered relative to the surface of the insulator layer 2.

The widths of the contact holes 4 are chosen such that the surrounding insulator layer 2 exercises a supporting effect on the metal 6 over the entire width of a contact hole 4, so that lowering of the metal surface is completely or virtually completely avoided.

By contrast, the widths of the alignment trenches 5 are considerably greater, so that the supporting effect is restricted to the edge regions of the metal 6 in this case. In the center of the alignment trenches 5, however, the metal 6 is lowered to a great extent by the polishing process. As can be seen from FIG. 3, the profiles of the lowered portions 7 are formed in such a way that the metal surface falls steeply in the edge region. In the center, the lowered portion 7 is in the form of a flat trough. The depth of the lowered portion 7 can essentially be determined by the pressure exerted during polishing.

In a further process step, the surface of the insulator layer 2 is subsequently treated chemically. As a result, a thin surface layer of the insulator layer 2 is etched away. The removal on the top side of the insulator layer 2 is chosen such that the metal areas in the region of the contact holes 4, as illustrated in FIG. 3, project slightly above the top side of the insulator layer 2. The lowered portions 7 of the metal layer 3 in the alignment trenches 5 remain virtually unaffected by this, however.

Since the bottoms of the alignment trenches 5 are formed by the planar top sides of the metal layer 3, the alignment trenches 5 have a constant, uniform depth. What is advantageous here, in particular, is that the depths of the alignment trenches 5 can be produced with high reproducibility through the use of the metal layer 3.

Correspondingly, the filling of the alignment trenches 5 with metal 6 can also be carried out with high reproducibility, so that the lowered portions 7 on the top sides of the filling also form regular and reproducible area profiles. Therefore, lasting residues of polishing agent, which would lead to local disruptions of the area profiles of the lowered portions 7, do not settle on the lowered portions 7 during the chemical mechanical polishing.

Figure 4:
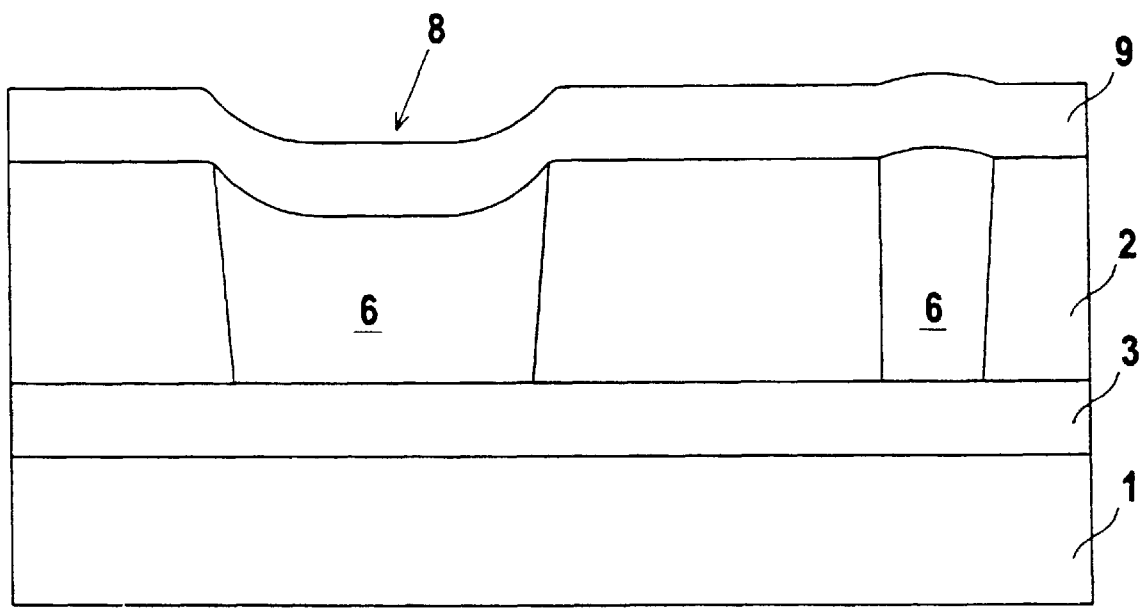

As can be seen from FIG. 4, in a concluding method step a second metal layer 9 is applied to the insulator layer 2, the metal layer preferably being composed of tungsten. The layer thickness of this second metal layer 9 is preferably about 300 nm.

The top side of this metal layer 9 runs in the region of the insulator layer 2 in a horizontal plane parallel to the top side of the metal layer 9. The top side of the metal layer 9 has a somewhat elevated profile in the region of the contact holes 4, this elevation corresponding approximately to the projection of the surface of the metal 6 above the insulator layer 2 in the contact holes 4. In the region of the alignment trenches 5, said metal layer 9 is applied to the lowered portions 7, so that depressions 8 are formed there on the top side of the metal layer 9.

These depressions 8 form the alignment marks. In this case, their area profiles correspond with high conformity to the area profiles of the lowered portions 7 on the top sides of the alignment trenches 5. The depressions 8 can be fabricated with high reproducibility in accordance with the previous processing steps. What is essential here is that a steep fall is obtained in the edge regions of the depressions 8 in a manner corresponding to the lowered portions 7. As a result, the alignment marks can be reliably detected by means of optical measuring instruments, such as laser interferometers, for example.

In this case, the alignment marks can be designed as so-called alignment marks or as so-called overlay marks. In this case, alignment marks serve for aligning different layer planes relative to one another. Overlay marks serve for determining position errors in layer planes. By way of example, overlay marks can be used to determine the position error with respect to the insulator layer 2 with the contact holes 4.

In the present exemplary embodiment, the alignment marks serve for aligning a resist mask, which is applied to the metal layer 9, relative to this metal layer 9.

Such a resist mask has a resist layer in which a hole pattern is made using a photolithographic method. For this purpose, the semiconductor structures 1 are positioned by means of a stepper in a suitable manner with respect to the exposure source for the purpose of exposing predetermined locations of the resist structures. This positioning is carried out using the alignment marks according to the invention.

We claim:

1. A method of producing alignment marks in a structure with integrated circuits, which comprises the following method steps:

forming a first metal layer over a semiconductor substrate with integrated circuits, the first metal layer having a thickness and a surface;

applying an insulator layer on the first metal layer, the insulator layer having a thickness significantly greater than the thickness of the first metal layer;

etching contact holes and alignment trenches into the insulator layer, the contact holes and the alignment trenches in each case opening out at the first metal layer and the alignment trenches having widths significantly greater than widths of the contact holes;

introducing metal into the alignment trenches and the contact holes and subsequently treating surface of the insulator layer with chemical mechanical polishing, wherein metal areas within the alignment trenches and the contact holes form polished top sides, the metal areas are lowered in a region of the alignment trenches and form profiles for the alignment marks; and subsequently depositing a second metal layer on the insulator layer and on the top sides of the metal areas within the alignment trenches and the contact holes, whereby local depressions are formed on a top side of the second metal layer in the region of the alignment trenches in accordance with the respective profiles, and wherein the depressions form alignment marks.

2. The method according to claim 1, wherein the chemical mechanical polishing comprises an etching process in which a thin surface layer of the insulator layer is removed, so that the metal areas in the region of the contact holes project slightly above a top surface of the insulator layer.

3. The method according to claim 1, which comprises forming the first metal layer of a material selected from the group consisting of tungsten and AlCu.

4. The method according to claim 1, which comprises filling the alignment trenches and contact holes with tungsten.

5. The method according to claim 1, which comprises forming the second metal layer of tungsten.

6. The method according to claim 1, wherein the insulator layer is an oxide layer.

7. The method according to claim 6, wherein the oxide layer is composed of $SiO_2$.

8. The method according to claim 1, wherein the second metal layer has a layer thickness of about 300 nm.

9. The method according to claim 1, wherein the insulator layer has a layer thickness of about 500 nm.

10. The method according to claim 1, which comprises setting the widths of the contact holes to be considerably less than the widths of the alignment trenches.

11. The method according to claim 10, wherein the widths of the alignment trenches are about 2 $\mu$m.

12. The method according to claim 10, wherein the widths of the contact holes are about 0.3 $\mu$m.

13. The method according to claim 1, wherein the alignment marks are configured as marks selected from the group consisting of alignment marks and overlay marks.

14. The method according to claim 1, which comprises arranging the alignment marks in a sawing frame of a wafer forming the semiconductor substrate.

15. The method according to claim 14, which comprises using the alignment marks for aligning a resist mask with the second metal layer.

16. The method according to claim 15, which comprises using the alignment marks to determine a position error with respect to the plane with the contact holes.

17. The method according to claim 1, which comprises providing the semiconductor substrate with a DRAM cell arrangement.

* * * * *